United States Patent [19]
Tsuchimoto et al.

[11] Patent Number: 5,723,887
[45] Date of Patent: Mar. 3, 1998

[54] SEMICONDUCTOR MEMORY DEVICE AND MANUFACTURING METHOD THEREOF

[75] Inventors: Junichi Tsuchimoto; Kiyoshi Mori, both of Hyogo, Japan

[73] Assignee: Mitsubishi Denki Kabushiki Kaisha, Tokyo, Japan

[21] Appl. No.: 671,289

[22] Filed: Jun. 27, 1996

[30] Foreign Application Priority Data

Feb. 21, 1996 [JP] Japan .................................. 8-033691

[51] Int. Cl.$^6$ .................................................. H01L 27/108
[52] U.S. Cl. ................................. 257/309; 257/655
[58] Field of Search .............................. 257/306, 309, 257/607, 611, 655

[56] References Cited

U.S. PATENT DOCUMENTS 5,612,558  3/1997  Harshfield .................................. 257/306
5,623,243  4/1997  Watanabe et al. ........................ 257/309

OTHER PUBLICATIONS

Applied Physics, vol. 61, No. 11, pp. 1147–1151, by Watanabe, Sep. 1992.

*Primary Examiner*—Mark V. Prenty
*Attorney, Agent, or Firm*—Lowe, Price, LeBlanc & Becker

[57] ABSTRACT

A storage node electrode formed of doped amorphous silicon is provided on a silicon substrate. Silicon crystal grains are formed on the surface of the storage node electrode by annealing it in the atmosphere including $PH_3$. A capacitor insulating film and a cell plate electrode are formed to cover the surface of the storage node electrode including silicon crystal grains. Larger silicon crystal grains are accordingly provided on the surface of the storage node electrode, resulting in increased capacitance of the capacitor.

3 Claims, 5 Drawing Sheets

SEMICONDUCTOR MEMORY DEVICE AND MANUFACTURING METHOD THEREOF

BACKGROUND OF THE INVENTION

1. Field of the Invention

The present invention generally relates to a semiconductor memory device, and more particularly, to a semiconductor memory device improved such that it has increased capacitance of a capacitor. The present invention also relates to a method of manufacturing such a semiconductor memory device.

2. Description of the Background Art

Three dimensional structure is essential to the capacitor of Dynamic Random Access Memory (DRAM) due to the reduction of its cell size. Various capacitor structures have been proposed. For example, the capacitor structures such as fin type and crown type are known. One proposed method of increasing the surface area of a capacitor electrode (storage node electrode) formed of polysilicon is to form concave and convex parts on the surface. The polysilicon thus obtained is called rugged polysilicon for its surface structure.

A method of manufacturing a semiconductor memory device having a capacitor of the rugged polysilicon is disclosed, for example, in Applied Physics, Vol. 61, No.11, p.p. 1147–1151. The method will be hereinafter described with reference to appended figures.

Referring to FIG. 10, an interlayer insulating film 2 is formed on a silicon substrate 1. A contact hole 2a for exposing the surface of silicon substrate 1 is provided in interlayer insulating film 2.

Referring to FIG. 11, an amorphous silicon 3 doped with phosphorus is formed on silicon substrate 1 such that it fills contact hole 2a. Doping of phosphorus is for the purpose of making amorphous silicon 3 conductive.

With reference to FIGS. 11 and 12, doped amorphous silicon 3 is patterned to form a storage node electrode 4.

With reference to FIGS. 12 and 13, by annealing storage node 4 in disilane atmosphere, silicon crystal grains 4a are formed on its surface, producing storage node electrode 4 with concave and convex portions on its surface. Silicon crystal grains 4a are derived from amorphous silicon, grown into crystal by annealing. Although not shown in figures, a capacitor insulating film is then formed on the surface of storage node electrode 4, and a cell plate electrode is further formed thereon to complete a semiconductor memory device.

The outer surface area of the storage node electrode 4 is increased because concave and concave portions are formed thereon, resulting in an increased capacitance of the capacitor.

Using the conventional method of forming rugged polysilicon described above, however, a storage node electrode with sufficiently large surface area could not be obtained.

SUMMARY OF THE INVENTION

An object of the present invention, therefore, is to provide a method of manufacturing a semiconductor memory device improved such that the surface of its storage node electrode has more noticeable concave and convex portions.

Another object of the present invention is to provide a method of manufacturing a semiconductor memory device improved in safety in regard to toxicity.

Still another object of the present invention is to obtain a semiconductor memory device thus formed according to above method, the device provided with storage node electrode having a specific distribution of impurity concentration.

A semiconductor memory device according to a first aspect of the invention is provided with a semiconductor substrate. A storage node electrode with silicon crystal grains integrally formed on its surface is provided on the semiconductor substrate. A capacitor insulating film is deposited on the semiconductor substrate, covering the outer surface of the storage node electrode. A cell plate electrode covers the storage node electrode with the capacitor insulating film interposed. The storage node electrode is doped with phosphorus. The concentration of the phosphorus is continuously decreased from the surface of the storage node electrode inward.

A semiconductor memory device according to a second aspect of the invention is provided with a semiconductor substrate. A storage node electrode with silicon crystal grains formed integrally on its surface is provided on the semiconductor substrate. A capacitor insulating film is deposited on the semiconductor substrate, covering the outer surface of the storage node electrode. A cell plate electrode covers the storage node electrode with the capacitor insulating film interposed. The storage node electrode is doped with arsenic.

According to a preferred embodiment of the invention, the concentration of the arsenic is continuously decreased from the surface of the storage node electrode inward.

In a method of manufacturing a semiconductor memory device according to a third aspect of the invention, a storage node electrode formed of doped amorphous silicon is provided on a silicon substrate. The storage node electrode is annealed in an atmosphere including $PH_3$, generating silicon crystal grains on its surface. The surface of the storage node electrode is covered with a capacitor insulating film. A cell plate electrode is formed on the semiconductor substrate to cover the surface of the storage node electrode with the capacitor insulating film interposed.

In a method of manufacturing a semiconductor memory device according to a fourth aspect of the invention, a storage node electrode formed of doped amorphous silicon is provided on a silicon substrate. The storage node electrode is annealed in an atmosphere including silicon hydride, then annealed in an atmosphere including $PH_3$, thereby producing silicon crystal grains on the surface thereof. The surface of the storage node electrode is covered with a capacitor insulating film. A cell plate electrode is formed on the semiconductor substrate to cover the surface of the storage node electrode with the capacitor insulating film interposed.

In a method of manufacturing a semiconductor memory device according to a fifth aspect of the invention, a storage node electrode formed of doped amorphous silicon is provided on a silicon substrate. The storage node electrode is annealed in an atmosphere including arsenic hydride, producing silicon crystal grains on its surface. The surface of the storage node electrode is covered with a capacitor insulating film. A cell plate electrode is formed on the semiconductor substrate to cover the surface of the storage node electrode with the capacitor insulating film interposed.

According to a preferred embodiment of the invention, the silicon hydride is selected from the group consisting of $SiH_4$, $Si_2H_6$, and $SiH_2Cl_2$.

The atmosphere including $PH_3$ is selected from the group consisting of the following (a), (b), and (c).

(a) atmosphere of $PH_3$ only (b) atmosphere of $PH_3$ and nitrogen (c) atmosphere of PH$_3$ and hydrogen According to the first and second aspects of the invention, the semiconductor memory device has an increased surface area of the storage node electrode because concave and convex portions are formed thereon.

Using the method of manufacturing a semiconductor memory device according to the third aspect of the invention, a storage node electrode having larger silicon crystal grains is obtained since the storage node electrode is annealed in an atmosphere including PH$_3$.

Using the method of manufacturing a semiconductor memory device according to the fourth aspect of the invention, much larger silicon crystal grains are formed compared with those formed by annealing the storage node electrode only in an atmosphere including silicon hydride, since the storage node electrode is annealed in an atmosphere including silicon hydride and then annealed in an atmosphere including PH$_3$ to produce silicon crystal grains on its surface.

Using the method of manufacturing a semiconductor memory device according to the fifth aspect of the invention, a storage node electrode having larger silicon crystal grains on its surface is obtained since the surface of the storage node electrode is annealed in an atmosphere including arsenic hydride.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to appended figures.

[Embodiment 1]

Figure 1:
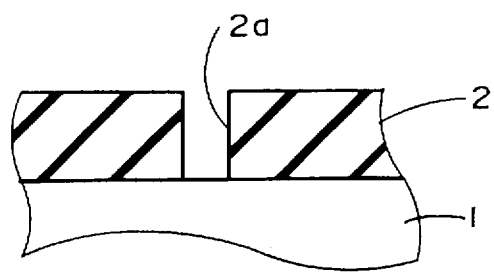
FIGS. 1 to 6 are cross sections of a semiconductor memory device in the first to sixth steps of a method of manufacturing a semiconductor memory device according to an embodiment of the invention.

With reference to FIG. 1, an interlayer insulating film 2 is formed on a silicon substrate 1. A contact hole 2a for exposing the surface of silicon substrate 1 is provided in interlayer insulating film 2.

Figure 2:
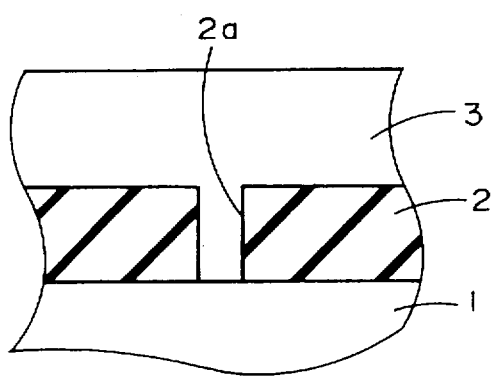

Referring to FIGS. 1 and 2, an amorphous silicon 3 doped with phosphorus is deposited 3000–7000 Å (preferably 5000 Å) thick such that it fills contact hole 2a. At this time, the film of amorphous silicon 3 was formed by using a vertical low pressure CVD apparatus, with 800 sccm (standard cubic centimeter per minute) of SiH$_4$, 10 sccm of PH$_3$, a pressure of 1 torr, and a temperature of 520°–530° C. The concentration of phosphorus within the film thus obtained was $5 \times 10^{20}$/cm$^3$. It is noted that a preferred result will be obtained by adjusting the concentration of phosphorus to be within a range from $2 \times 10^{20}$ to $6 \times 10^{20}$/cm$^3$.

Figure 3:
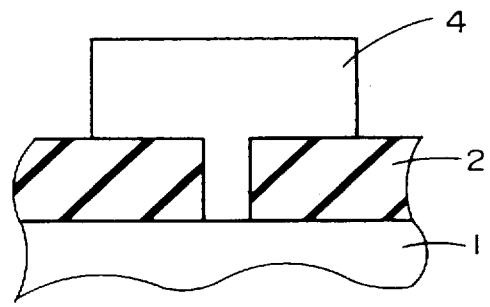

With reference to FIGS. 2 and 3, doped amorphous silicon film 3 was formed into a storage node electrode 4 by normal photolithography and dry etching using chlorine type gas as etchant.

Figure 4:
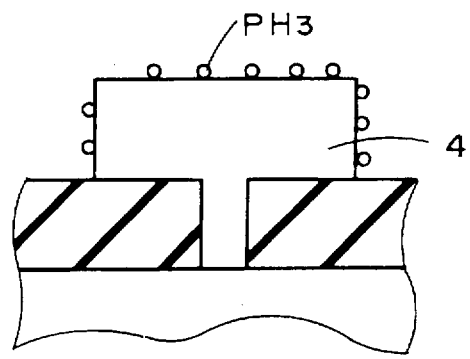
Figure 5:
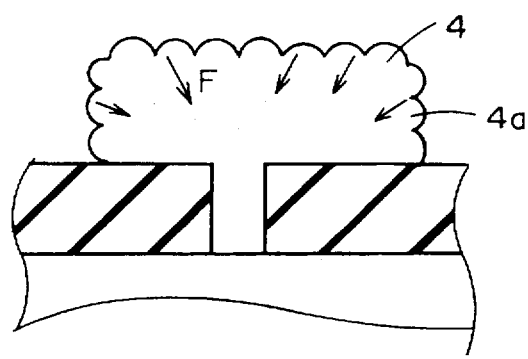

Referring to FIGS. 4 and 5 next, the surface of storage node electrode 4 was made rugged. The process is proceeded utilizing a short time annealing apparatus which performs lamp annealing. The processing temperature was 680°–760° C. (preferably 750° C.), and the processing time was 2 minutes. As an atmosphere within the chamber, PH$_3$ gas was used and a pressure was set to 1 motor.

A mechanism of forming a rugged surface could be considered as follows. With reference to FIG. 4, PH$_3$ is attached on the surface of storage node electrode 4, and amorphous silicon is grown to crystal with the PH$_3$ serving as nucleus, and silicon crystal grains 4a are formed on the outer surface of storage node electrode 4.

The formation of silicon crystal grains 4a was confirmed using a Scanning Electron Microscope (SEM). The height of silicon crystal grains 4a was 700–800 Å.

Figure 7:
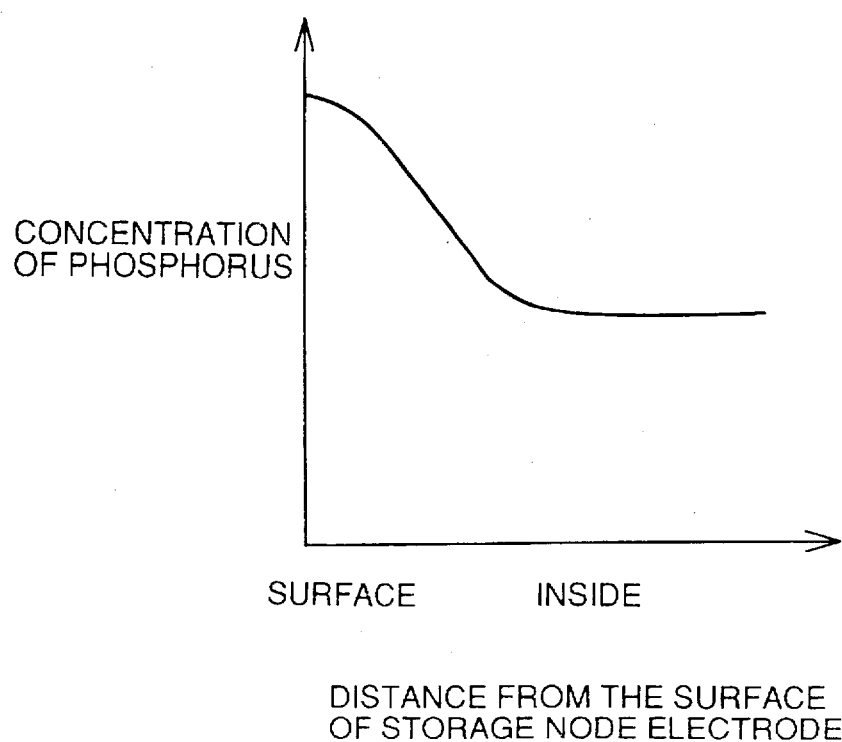
FIG. 7 shows a profile of the concentration of phosphorus within the storage node electrode obtained according to an embodiment of the invention.

Referring to FIG. 4 again, the PH$_3$ attached on the surface of storage node electrode 4 is diffused into storage node electrode 4 in the direction of the arrow F after acting as a nucleus. As a result, a storage node electrode is obtained which has such a distribution of the concentration of phosphorus as shown in FIG. 7. More specifically, the concentration of phosphorus is continuously decreased inward from the surface of storage node electrode 4, and maintained at a constant value from a certain point. It is noted that the ordinate shows the concentration of phosphorus, and the abscissa shows the distance inward from the surface of the storage node electrode.

The concentration of phosphorus at the surface of storage node electrode 4 is approximately $6 \times 10^{20}$/cm$^3$.

Although PH$_3$ is utilized in the embodiment described above, the present invention is not limited to it and the similar result could be obtained using AsH$_3$.

Figure 6:
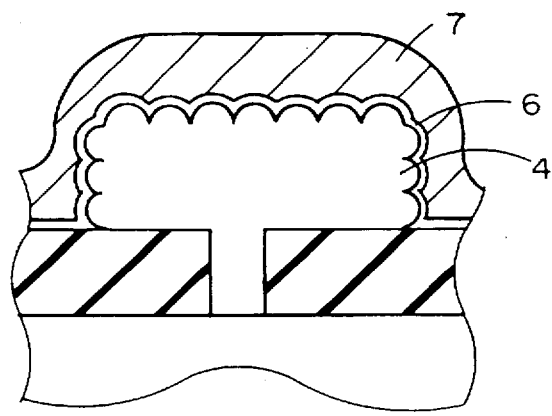

Referring to FIG. 6, a capacitor insulating film 6 is formed on silicon substrate 1 to cover the surface of storage node electrode 4. A cell plate electrode 7 is formed to cover storage node electrode 4 interposed by capacitor insulating film 6, completing the capacitor.

[Embodiment 2]

The figures showing the process of manufacturing in accordance with Embodiment 2 are similar to FIGS. 1–6. The present embodiment is different from Embodiment 1 in the condition of annealing, as follows.

Si$_2$H$_6$ was introduced into a chamber at a flow rate of 30 sccm, and annealing was performed for 30 minutes at 750° C. Immediately after the supply of Si$_2$H$_6$ gas was stopped, only 100 sccm of PH$_3$ was introduced, and maintained for 90 seconds as it was. The surface of the sample taken from the chamber was observed using the Scanning Electrode Microscope as Embodiment 1, showing the surface illustrated in FIG. 8.

Figure 8:
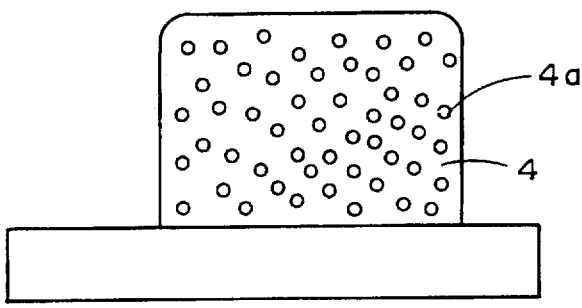
FIG. 8 schematically shows an SEM photograph of the surface of the storage node electrode obtained using a method of manufacturing a semiconductor according to device according to an embodiment of the invention.

With reference to FIG. 8, it was understood that silicon crystal grains 4a were uniformly formed over the surface of storage node electrode 4 in accordance with this method.

Figure 9:
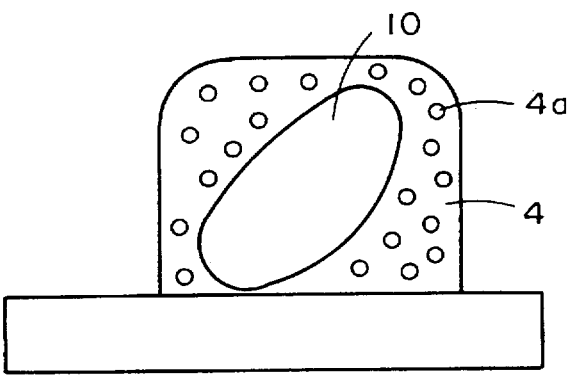
FIG. 9 schematically shows an SEM photograph of the surface of the storage node electrode obtained according to a conventional method.
Figure 10:
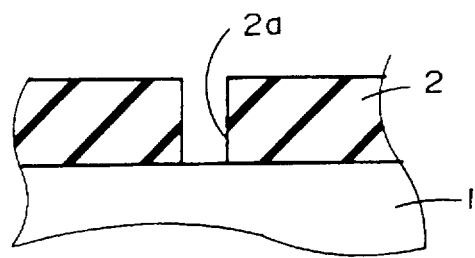
FIGS. 10 to 13 are cross sections of a semiconductor memory device in the first to fourth steps of manufacturing a conventional semiconductor memory device.
Figure 11:
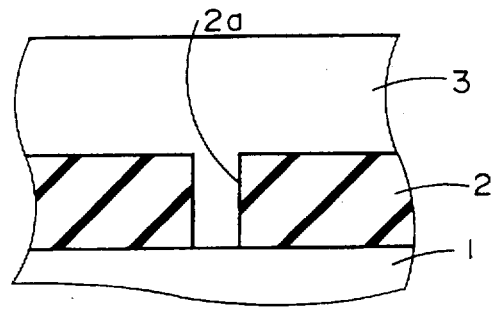
Figure 12:
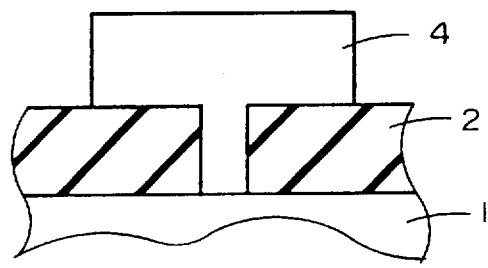
Figure 13:
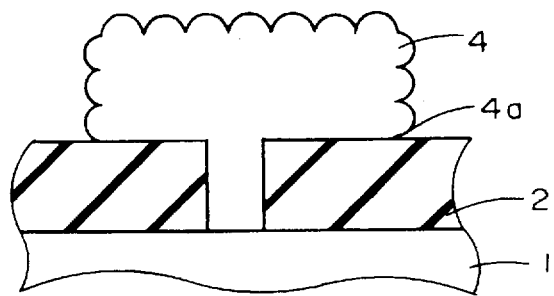

FIG. 9 shows a result of SEM observation of the sample obtained according to the conventional method shown in FIGS. 10–13. According to the conventional method, it is found that there is an area 10 where crystal grains 4a are not formed in the surface of storage node electrode 4. By referring to and comparing these SEM photographs, it is accordingly understood that silicon crystal grains 4a are more closely formed on storage node electrode 4 of the sample annealed in $Si_2H_6$ atmosphere then further annealed in the atmosphere of $PH_3$ gas.

[Embodiment 3]

Steps of manufacturing according to this embodiment are similar to those shown in FIGS. 1–6. The present embodiment is different from Embodiments 1 and 2 in the condition of annealing.

According to this embodiment, annealing was performed in the mixed gas of $Si_2H_6$=30 sccm and $PH_3$=100 sccm. The annealing under above condition resulted in similar effects to Embodiment 2. It is noted that a similar effect is obtained if the amount of $PH_3$ is varied within the range of 100 sccm–1 SLM (Standard Liter per Minute) when $Si_2H_6$ is 30 sccm.

It is further noted that the surface could be made rugged remarkably by using $PH_3$ diluted to approximately 1% by nitrogen or hydrogen gas in order to use toxic $PH_3$ gas more safely, compared with the conventional embodiment in which $PH_3$ is not added (FIGS. 10–13).

Although $SiH_4$ is used as silicon hydride in above described embodiment, the present invention is not limited to it and $Si_2H_6$ and $SiH_2Cl_2$ could preferably be used.

As is illustrated above, the surface of the storage node electrode can be made rugged by annealing in the atmosphere including $PH_3$ or $AsH_4$ according to the present invention. As a result, the storage node electrode with large surface area could be obtained. An additional effect of efficient use of a capacitor could be obtained, as $PH_3$ or $AsH_3$ thermally diffused in the storage node electrode serves as a donor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a semiconductor substrate;

a storage node electrode provided on said semiconductor substrate and having integrally formed silicon crystal grains on its surface;

a capacitor insulating film provided on said semiconductor substrate to cover the outer surface of said storage node electrode including said silicon crystal grain; and a cell plate electrode covering said storage node electrode with said capacitor insulating film interposed, wherein phosphorous is doped in said silicon crystal grains, and concentration of said phosphorous is continuously decreased inward from the surface of said silicon crystal grains.

2. A semiconductor memory device, comprising:

a semiconductor substrate;

a storage node electrode provided on said semiconductor substrate and having silicon crystal grains integrally formed on its surface;

a capacitor insulating film provided on said semiconductor substrate to cover the outer surface of said storage node electrode including said silicon crystal grains; and a cell plate electrode covering said storage node electrode with said capacitor insulating film interposed, wherein arsenic is doped in said silicon crystal grains, and the concentration of said arsenic is continuously decreased inward from the surface of said silicon crystal grains.

3. The semiconductor memory device according to claim 1, wherein height of said silicon crystal grains is 700–800 Å.

* * * * *

UNITED STATES PATENT AND TRADEMARK OFFICE
CERTIFICATE OF CORRECTION

PATENT NO. : 5,723,887
DATED : March 3, 1998
INVENTOR(S) : Tsuchimoto et al.

It is certified that error appears in the above-identified patent and that said Letters Patent is hereby corrected as shown below:

Column 5, line 35, please delete "$AsH_4$" and insert --$AsH_3$--.

Signed and Sealed this

Sixteenth Day of May, 2000

Attest:

Q. TODD DICKINSON

*Attesting Officer*          *Director of Patents and Trademarks*